United States Patent
Lee et al.

(10) Patent No.: US 9,587,789 B2
(45) Date of Patent: Mar. 7, 2017

(54) METHODS AND APPARATUS FOR PROVIDING A GAS MIXTURE TO A PAIR OF PROCESS CHAMBERS

(71) Applicant: APPLIED MATERIALS, INC., Santa Clara, CA (US)

(72) Inventors: Jared Ahmad Lee, Santa Clara, CA (US); Martin Jeffrey Salinas, San Jose, CA (US); Ezra Robert Gold, Sunnyvale, CA (US); James P. Cruse, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 514 days.

(21) Appl. No.: 14/091,942

(22) Filed: Nov. 27, 2013

(65) Prior Publication Data
US 2014/0076850 A1    Mar. 20, 2014

Related U.S. Application Data

(62) Division of application No. 12/907,944, filed on Oct. 19, 2010, now Pat. No. 8,616,224.

(60) Provisional application No. 61/330,032, filed on Apr. 30, 2010.

(51) Int. Cl.
| | |
|---|---|
| B08B 3/00 | (2006.01) |
| F17D 3/03 | (2006.01) |
| H01J 37/32 | (2006.01) |
| H01L 21/02 | (2006.01) |
| H01L 21/67 | (2006.01) |

(52) U.S. Cl.
CPC ............ *F17D 3/03* (2013.01); *H01J 37/3244* (2013.01); *H01J 37/32899* (2013.01); *H01L 21/02071* (2013.01); *H01L 21/6719* (2013.01); *H01L 21/67201* (2013.01); *Y10T 137/0318* (2015.04); *Y10T 137/877* (2015.04)

(58) Field of Classification Search
None
See application file for complete search history.

(56) References Cited

U.S. PATENT DOCUMENTS

| | | | |
|---|---|---|---|
| 7,846,845 B2 | 12/2010 | Bahng et al. | |
| 2003/0147787 A1 | 8/2003 | Borgstrom | |
| 2004/0069226 A1 | 4/2004 | Yoshida et al. | |
| 2008/0099040 A1 | 5/2008 | Bahng et al. | |

*Primary Examiner* — Eric Golightly
(74) *Attorney, Agent, or Firm* — Moser Taboada; Alan Taboada

(57) ABSTRACT

A method and apparatus for supplying a gas mixture to a load lock chamber is described. In one embodiment, the apparatus supplies a gas mixture to a pair of process chambers, comprising a first ozone generator to provide a first gas mixture to a first process chamber, a second ozone generator to provide a second gas mixture to a second process chamber, a first gas source coupled to the first ozone generator via a first mass flow controller and a first gas line, and coupled to the second ozone generator via a second mass flow controller and a second gas line, and a second gas source coupled to the first ozone generator via a third mass flow controller and a third gas line and coupled to the second ozone generator via fourth mass flow controller and a fourth gas line.

18 Claims, 4 Drawing Sheets

METHODS AND APPARATUS FOR PROVIDING A GAS MIXTURE TO A PAIR OF PROCESS CHAMBERS

CROSS-REFERENCE TO RELATED APPLICATIONS

This application is a divisional of U.S. patent application Ser. No. 12/907,944, filed Oct. 19, 2010, and issued as U.S. Pat. No. 8,616,224 on Dec. 31, 2013, which claims benefit of U.S. provisional patent application Ser. No. 61/330,032, filed Apr. 30, 2010. Each of the aforementioned related patent applications is herein incorporated by reference.

FIELD

Embodiments of the present invention generally relate to substrate processing systems.

BACKGROUND

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

To remove the residues from the processed substrate, an abatement process may be performed. The abatement process may include heating the processed substrate to a desired temperature while providing one or more process gases, such as ozone, to promote the outgassing of residues from the substrate surface and to abate the outgassed residues. Previously, the abatement process has been performed independently in one or more process chambers. However, the inventors, in working to develop a new process platform where abatement processes run concurrently in a pair of process chambers, have observed that certain conventional process gas delivery systems have configurations that may lead to inaccuracies in the gas delivered to the process chamber when concurrently providing shared process gases to the pair of process chambers.

Therefore, the inventors have provided an improved method and apparatus for providing a gas mixture to a pair of process chambers.

SUMMARY

Various embodiments of the present invention generally comprise a method and apparatus for providing a gas mixture into a load lock chamber. In some embodiments, the apparatus comprises a first ozone generator to provide a first gas mixture to a first process chamber, a second ozone generator to provide a second gas mixture to a second process chamber, a first gas source coupled to the first ozone generator via a first mass flow controller and a first gas line, and coupled to the second ozone generator via a second mass flow controller and a second gas line, and a second gas source coupled to the first ozone generator via a third mass flow controller and a third gas line and coupled to the second ozone generator via fourth mass flow controller and a fourth gas line.

In some embodiments, a method for supplying a gas mixture to a load lock chamber, comprises simultaneously providing a first gas from a first gas source to a first ozone generator via a first mass flow controller and to a second ozone generator via a second mass flow controller, while providing the first gas, simultaneously providing a second gas from a second gas source to the first ozone generator via a third mass flow controller and to the second ozone generator via a fourth mass flow controller, forming a first ozone containing gas mixture in the first ozone generator and a second ozone containing gas mixture in the second ozone generator, and providing the first ozone containing gas mixture to a second process chamber.

Other and further embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
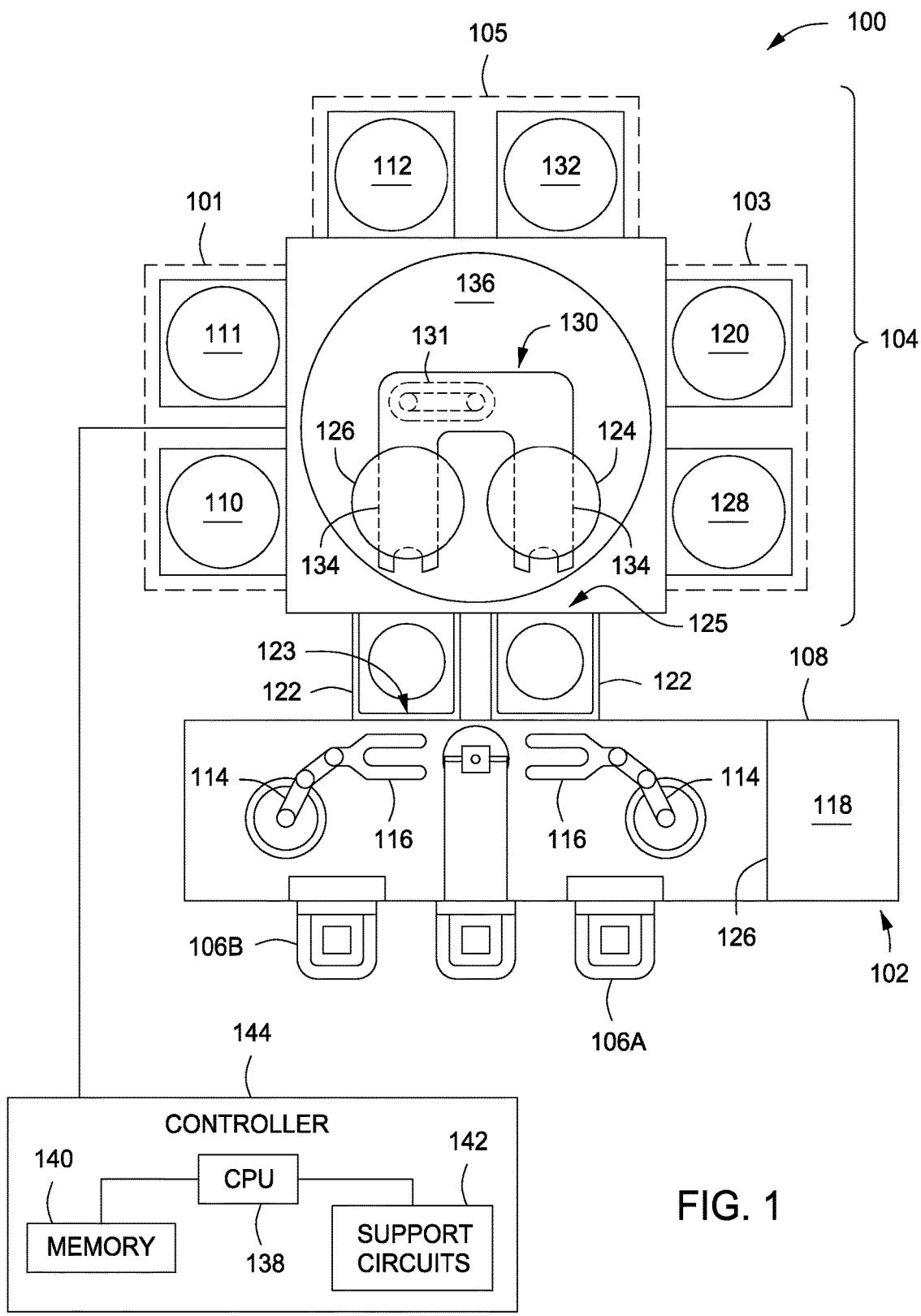
FIG. 1 depicts a schematic top view of a processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for providing a gas mixture to a pair of process chambers are provided herein. The inventive methods and apparatus may facilitate more accurate control over the gas mixture when shared gases are split and provided to multiple process chambers.

FIG. 1 is a schematic, top plan view of an exemplary processing system 100 suitable for practicing embodiments of the present invention. In some embodiments, the exemplary processing system 100 may include a twin chamber processing system, such as illustrated in FIG. 1. Referring to FIG. 1, in some embodiments, the processing system 100 may generally include a vacuum-tight processing platform 104, a factory interface 102, one or more twin chamber processing systems 101, 103, 105 and a system controller 144. Examples of a processing system that may be suitably modified in accordance with the teachings provided herein include the Centura® integrated processing system, one of the PRODUCER® line of processing systems (such as the PRODUCER® GT™), ADVANTEDGE™ processing systems, or other suitable processing systems commercially available from Applied Materials, Inc., located in Santa Clara, Calif. Other processing systems may be adapted to benefit from the invention. One example of a twin chamber processing system that may be modified to incorporate the present invention in accordance with the teachings herein is described in U.S. Provisional Patent Application Ser. No. 61/330,156, filed Apr. 30, 2010, by Ming Xu et al., and entitled, "Twin Chamber Processing System."

The platform 104 includes a vacuum substrate transfer chamber 136 having the one or more twin chamber processing systems 101, 103, 105 (three shown in FIG. 1) coupled thereto. Each twin chamber processing system includes two process chambers (e.g., 110 and 111, 112 and 132, and 120 and 128). The platform further includes at least one loadlock chamber 122 (two shown in FIG. 1) that are coupled to the vacuum substrate transfer chamber 136. The factory interface 102 is coupled to the transfer chamber 136 via the load lock chambers 122.

Each twin chamber processing system 101, 103, 105 includes independent processing volumes that may be isolated from each other. For example, the first and second process chambers of each twin include first and second processing volumes that may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing. In addition, each twin chamber processing system 101, 103, 105 may be configured to share resources (e.g., process gas supply, vacuum pump, or the like) between each process chamber of the twin chamber processing system. As such, the twin chamber processing system further advantageously utilizes shared resources that facilitate reduced system footprint, hardware expense, utilities usage and cost, maintenance, and the like, while at the same time promoting higher substrate throughput. For example, shared hardware may include one or more of a process foreline and roughing pump, AC distribution and DC power supplies, cooling water distribution, chillers, multi-channel thermo controllers, gas panels, controllers, and the like.

The factory interface 102 may comprise at least one docking station 108 and at least one factory interface robot (two shown in FIG. 1) 114 to facilitate transfer of substrates. The docking station 108 may be configured to accept one or more (two shown in FIG. 1) front opening unified pods (FOUPs) 106A-B. The factory interface robot 114 may comprise a blade 116 disposed on one end of the robot 114 configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPs 106A-B.

Each of the load lock chambers 122 may comprise a first port 123 coupled to the factory interface 102 and a second port 125 coupled to the transfer chamber 136. The load lock chambers 122 may be coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The load lock chambers 122 may be configured as a process chamber and may form a portion of an abatement system for receiving and processing effluents from a semiconductor process chamber, for example, the process chambers 110, 112, 132, 128, 120. The load lock chambers 122 may be used to perform an abatement process to abate a single process chamber or tool, or multiple process chambers and/or tools. An exemplary abatement system, for example, may include one or more of a scrubber, a thermal reactor (i.e., combustion reactor), a hydrogenation reactor, or the like. For example, an effluent exhausted from a chamber configured for etch processes may include halogens such as chlorine ($Cl_2$) and unsaturated hydrocarbons, such as ethylene ($C_2H_4$) or propylene ($C_3H_6$). The effluent, for example, may be initially injected into hydrogenation reactor which can be used to convert unsaturated hydrocarbons into saturated hydrocarbons, or halogens into hydrogen-containing gases. For example, chlorine ($Cl_2$) may be converted into hydrochloric acid (HCl), and ethylene ($C_2H_6$) may be converted into ethane ($C_2H_6$).

The abatement system described above is merely exemplary, and other abatement or support systems may benefit from the inventive methods and apparatus described herein. For example, a catalytic abatement system may be used, for example, in combination with a scrubber. A scrubber may be used prior to, or after an effluent is flowed into a catalytic reactor to remove gaseous or particulate components of the effluent that can damage, or reduce the effectiveness of, the catalytic reactor. The catalytic reactor may comprise a catalytic surface that catalyzes a reaction that converts the effluent into either an environmentally safe material, or a material that may be removed by, for instance, a scrubber or combustion reactor. The catalytic surface may be in the form of a structure made from catalytic material or supporting a finely divided catalyst, a bed of foam or pellets, or a coating on a wall or component of the catalytic reactor. The catalytic surfaces may be on, for example, a support structure comprising a ceramic material, such as cordierite, $Al_2O_3$, silicon carbide, silicon nitride, or the like.

The transfer chamber 136 has a vacuum robot 130 disposed therein. The vacuum robot 130 may include one or more transfer blades 134 (two shown in FIG. 1) coupled to a movable arm 131. For example, in some embodiments, where twin chamber processing systems are coupled to the transfer chamber 136 as shown, the vacuum robot 130 may comprise two parallel blades 134 configured such that the vacuum robot 130 may simultaneously transfer two substrates 124, 126 from the load lock chambers 122 to the process chambers of a twin chamber processing system, for example, process chambers 110, 111 of the twin chamber processing system 101.

The process chambers 110, 111 or 112, 132 or 128, 120 of each twin chamber processing system 101, 103, 105 may be any type of process chamber utilized in substrate processing, for example, such as etch chambers, deposition chambers, or the like. In some embodiments, each process chamber of the twin chamber processing system are configured for the same function, for example, etching. For example, in embodiments where each process chamber of a twin chamber processing system is an etch chamber, each process chamber may include a plasma source, for example, an inductive or capacitively coupled plasma source, a remote plasma source or the like. Further, each process chamber of a twin chamber processing system may use a halogen-containing gas, for example, provided by a shared gas panel (as discussed below), to etch substrates (e.g., substrates 124, 126) disposed therein. Examples of halogen-containing gas include hydrogen bromide (HBr), chlorine ($Cl_2$), carbon tetrafluoride ($CF_4$), and the like. For example, after etching the substrates 124, 126, halogen-containing residues may remain on the substrate surface. The halogen-containing residues may be removed by a thermal treatment process in the load lock chambers 122, as discussed further below.

The system controller 144 is coupled to the processing system 100. The system controller 144 controls the operation of the system 100 using a direct control of the process chambers 110, 111, 112, 132, 128, 120 of the system 100 or alternatively, by controlling individual controllers (not shown) associated with the process chambers 110, 111, 112, 132, 128, 120 and/or each twin chamber processing system 101, 103, 105 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 500 for removing halogen-containing residues described below with reference to FIG. 5, when executed by the CPU 138, transform the CPU 138 into a specific purpose computer (controller) 144. The software routines may also be stored and/or executed by a second controller (not shown) that is located remotely from the system 100.

Figure 2:
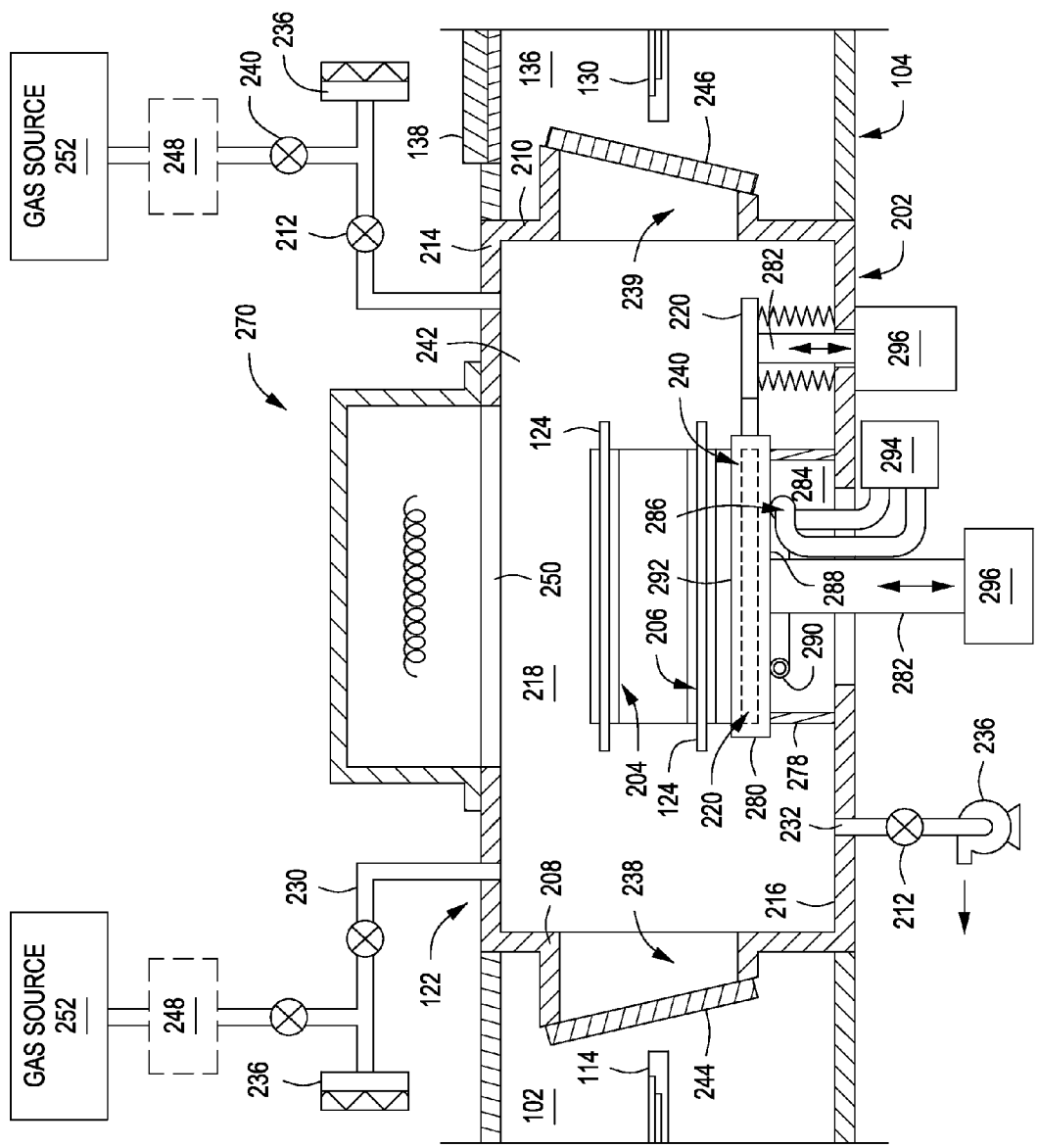
FIG. 2 depicts a side view of a load lock chamber utilized to perform a halogen-containing residue removal process in accordance with some embodiments of the present invention.

FIG. 2 depicts one embodiment of the load lock chamber 122 that may be utilized to perform a halogen-containing residue removal process. The load lock chamber 122 generally includes a chamber body 202, a first substrate holder 204, a second substrate holder 206, a temperature control pedestal 240 and a heater module 270. The chamber body 202 may be fabricated from a singular body of material such as aluminum. The chamber body 202 includes a first side wall 208, a second side wall 210, lateral walls (242 in FIG. 3), a top 214 and a bottom 216 that define a chamber volume 218. A window 250 typically fabricated from quartz, is disposed in the top 214 of the chamber body 202 and is at least partially covered by the heater module 270.

The pressure of the chamber volume 218 may be controlled so that the load lock chamber 122 may be evacuated to substantially match the environment of the transfer chamber 136 and be vented to substantially match the environment of the factory interface 102. Additionally, the pressure of the chamber volume 218 may be controlled within a predetermined range that facilitates performing the halogen-containing residues removal process, as further described below. The chamber body 202 includes one or more vent passages 230 and a pump passage 232. The vent passage 230 and the pump passage 232 are positioned at opposite ends of the chamber body 202 to induce laminar flow within the chamber volume 218 during venting and evacuation to minimize particulate contamination. In one embodiment, two vent passages 230 are disposed through the top 214 of the chamber body 202, while the pump passage 232 is disposed through the bottom 216 of the chamber body 202. The passages 230, 232 typically are coupled to a valve 212 to selectively allow flow into and out of the chamber volume 218. Alternatively, the passages 230, 232 may be positioned at opposite ends of one of the chamber walls, or on opposing or adjacent walls. In one embodiment, the vent passage 230 is coupled to a high efficiency air filter 236 such as available from Camfil Farr, Inc., of Riverdale, N.J.

The vent passage 230 may be additionally coupled to a gas source 252 through a valve 241 to provide a gas mixture into the chamber volume 218. In some embodiments, the vent passage 230 may be configured as a gas distribution ring wherein the gas mixture may be distributed from adjacent the walls 210, 208 through an array of holes to optimize the flow uniformity. In some embodiments, the gas mixture may be supplied to the load lock chamber 202 through a gas distribution plate (not shown) disposed below the heater module 270. The gas distribution plate may be fabricated by a material transmissive to the heat generated from the heater module 270 such as not to substantially interfere with the heating of the substrates positioned on the substrate holders 204, 206.

The gas source 252 may provide any gas required for a particular process being performed. For example, in some embodiments, the gas source 252 may provide at least one of nitrogen ($N_2$), argon (Ar), hydrogen ($H_2$), alkanes, alkenes, helium (He), oxygen ($O_2$), ozone ($O_3$), water vapor ($H_2O$), and the like.

Figure 3:
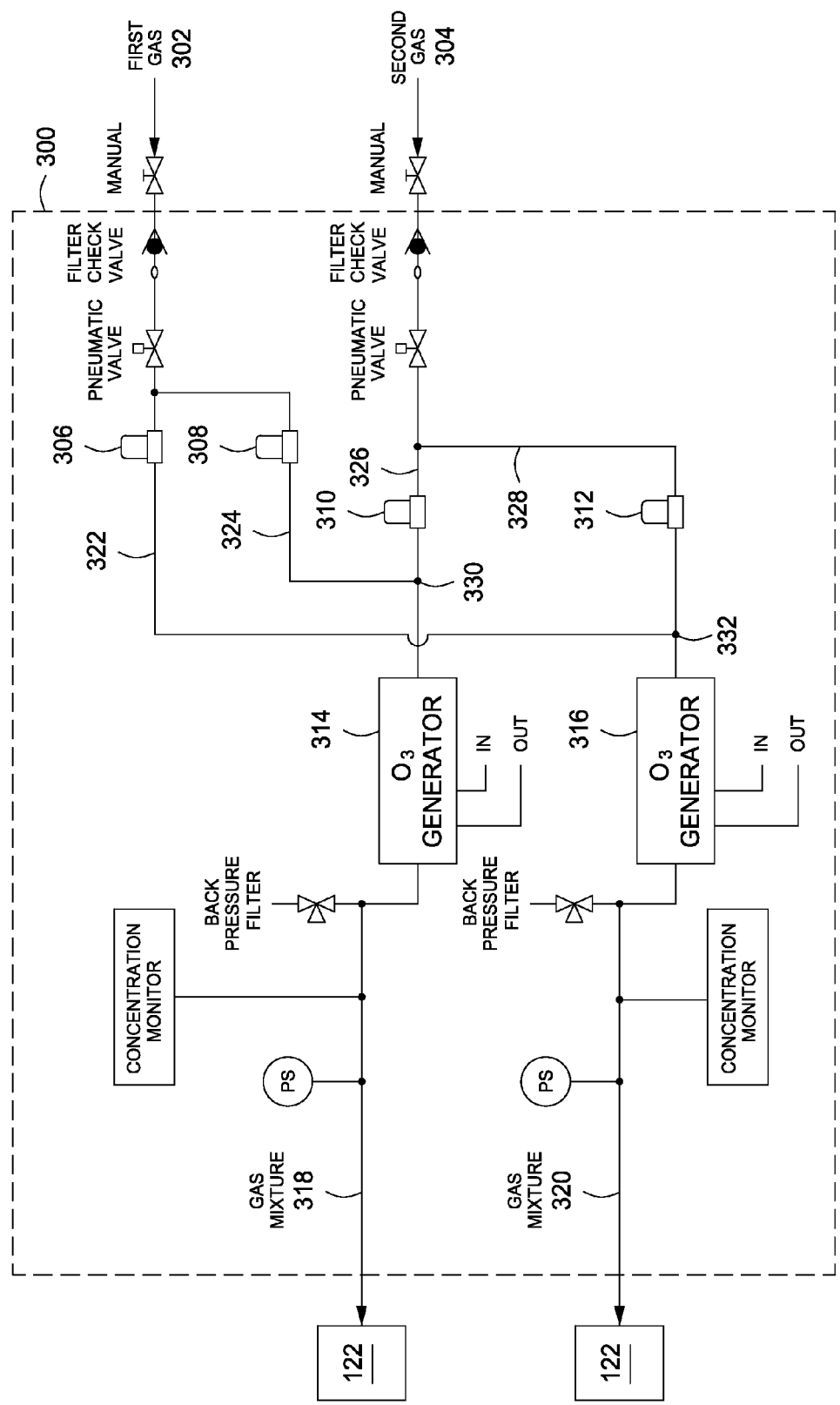
FIG. 3 depicts a schematic view of an ozone rack configured for providing a gas mixture to a pair of process chambers in accordance with some embodiments of the present invention.

In some embodiments, the gas source 252 may provide a mixture of ozone and nitrogen. In such embodiments the gas source 252 may include an ozone rack (as depicted in FIG. 3). The ozone rack may be configured to receive oxygen ($O_2$) and nitrogen ($N_2$) from a common source and then generate and deliver the mixture of ozone and nitrogen to each of a pair of process chambers (e.g., the load locks 122). For example, in some embodiments, nitrogen ($N_2$) may be provided at a flow rate in the range of about 100 ppm to about 0.2 percent of the total flow. In some embodiments, oxygen ($O_2$) may be provided at up to about 14.5 slm or more.

For example, FIG. 3 depicts an ozone rack 300 to provide the ozone nitrogen gas mixture to the pair of process chambers in accordance with some embodiments of the present invention. As shown in FIG. 3, in some embodiments, the ozone rack 300 may be configured for providing a first ozone containing gas mixture 318 and a second ozone containing gas mixture 320 to a pair of process chambers, such as the load lock chambers 122.

The gas source 252 further includes (or is coupled to) an oxygen gas source 304 and a nitrogen gas source 302. The oxygen gas source 304 and the nitrogen gas source 302 are coupled to the ozone rack 300 to provide a first gas (nitrogen) and a second gas (oxygen) to a pair of ozone generators 314, 316 in the ozone rack 300. The nitrogen gas source 302 is coupled the first ozone generator 314 via a first mass flow controller 308 and to the second ozone generator 316 via a second mass flow controller 306. The oxygen gas source 304 is coupled the first ozone generator 314 via a third mass flow controller 310 and to the second ozone generator 316 via a fourth mass flow controller 312.

As such, the first gas and the second gas each flow into independent mass flow controllers 306, 308, 310, 312, thereby advantageously preventing concentration differences of the first and second gases due to pressure fluctuations, as described further below. The mass flow controllers 308, 310 are coupled to the first ozone generator 314 via gas lines 324, 326 and the mass flow controllers 306, 312 are coupled to the second ozone generator 316 via gas lines 322, 328.

The mass flow controllers 306, 308 regulate pressure and flow rates of the first gas. In addition, mass flow controllers 310, 312 regulate pressure and flow rates of the second gas. For example, the mass flow controller 308 and the mass flow controller 310 regulate the flow of the first gas through the gas line 324 and the second gas through the gas line 326, respectively, into the first ozone generator 314 where the mixture of the first gas and the second gas is transformed into the first ozone containing the gas mixture 318. Similarly, the mass flow controller 306 and the mass flow controller 312 regulates the flow of the first gas through the gas line 322 and the second gas through the gas line 328, respectively, into the ozone generator 316 where the mixture of the first gas and the second gas is transformed into the second ozone containing the gas mixture 320.

In some embodiments, the gas line 324 and the gas line 326 join together downstream of each mass flow controller 308, 310 and upstream of the first ozone generator 314. In some embodiments, the gas line 324 and the gas line 326 join together at a common inlet 330 through which the first gas and the second gas are provided to the ozone generator 314. In some embodiments, the gas line 322 and the gas line 328 join together downstream of the mass flow controllers 306, 312 and upstream of the second ozone generator 316. In some embodiments, the gas lines 322, 328 join together at a common inlet 332 through which the first gas and the second gas are provided to the second ozone generator 316. By using independent mass flow controllers, amounts of the first gas and/or the second gas are not controlled by the supply pressure.

The first gas may include a nitrogen gas ($N_2$) and the second gas may include an oxygen gas ($O_2$). In some embodiments, the first gas (e.g., $N_2$) is injected downstream of the mass flow controllers 310, 312 for the second gas (e.g., $O_2$). As such, each of the mass flow controllers 306, 308, 310, 316 flow a single gas (i.e., $N_2$ or $O_2$) into any one of the ozone generators 314, 316 where the first gas and the second gas are transformed into the first and second ozone containing gas mixtures 318, 320. Hence, the composition of the gas mixtures 318, 320 is completely controlled by relative flow rates of the first and second gases.

Returning to FIG. 2, in some embodiments, a remote plasma source (RPS) 248 may be alternatively coupled to the vent passage 230 to assist in removing the halogen-containing residues from the substrate surfaces. The remote plasma source 248 provides plasma formed from the gas mixture provided by the gas source 252 to the load lock chamber 122. In embodiment the remote plasma source (RPS) 248 is present, a diffuser (not shown) may be disposed at the outlet of the vent passage 230 to facilitate delivery the generated plasma into the load lock chamber 122.

The pump passage 232 is coupled to a point-of-use pump 236, such as available from Alcatel, headquartered in Paris, France. The point-of-use pump 236 has low vibration generation to minimize the disturbance of the substrate 124 positioned on the holders 204, 206 within the load lock chamber 122 while promoting pump-down efficiency and time by minimizing the fluid path between the load lock chamber 122 and pump 236 to generally less than three feet.

A first loading port 238 is disposed in the first wall 208 of the chamber body 202 to allow the substrate 124 to be transferred between the load lock chamber 122 and the factory interface 102. A first slit valve 244 selectively seals the first loading port 238 to isolate the load lock chamber 122 from the factory interface 102. A second loading port 239 is disposed in the second wall 210 of the chamber body 202 to allow the substrate 124 to be transferred between the load lock chamber 122 and the transfer chamber 136. A second slit valve 246 which is substantially similar to the first slit valve 244 selectively seals the second loading port 239 to isolate the load lock chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204, 206 are generally mounted to a hoop 220 that is coupled to a shaft 282 that extends through the bottom 216 of the chamber body 202. Typically, each substrate holder 204, 206 is configured to retain one substrate. The shaft 282 is coupled to a lift mechanism 296 disposed exterior to the load lock chamber 122 that controls the elevation of the substrate holders 204 and 206 within the chamber body 202. A bellows 284 is coupled between the hoop 220 and the bottom 216 of the chamber body 202 and disposed around the shaft 282 to provide a flexible seal between the second substrate holder 206 and the bottom 216, thus preventing leakage from or into the chamber body 202 and facilitating raising and lowing of the substrate holders 204, 206 without compromising the pressure within the load lock chamber 122.

In operation, for example, the first substrate holder 204 may be utilized to hold an unprocessed substrate from the factory interface 102 while the second substrate holder 206 is utilized to hold a processed substrate (e.g., an etched substrate) returning from the transfer chamber 136. The flow within the load lock chamber 122 during venting and evacuation is substantially laminar due to the position of the vent passage 230 and pump passage 232 and is configured to minimize particulate contamination.

The temperature control pedestal 240 may be coupled to the bottom 216 of the chamber body 202 by a support 278, or may be movably coupled to the chamber body 202 by a second shaft 282 and lift mechanism 296. The support 278 may be hollow or include passages therethrough to allow fluids, electrical signals, sensor and the like to be coupled to the pedestal 240. In some embodiments, such as when the pedestal 240 is movable, the support 278 may include a bellows 284.

The temperature control pedestal 240 generally includes a platen 280 having a heat transfer element 286. The heater transfer element 286 may be a fluid passage disposed in the platen 280 or disposed in contact with a lower surface 288 of the platen 280. Alternatively, the heat transfer element 286 may be a circulated water jacket, a thermoelectric device, such as a Peltier device, or other structure that may be utilized to control the temperature of the platen 280.

In some embodiments, the heat transfer element 286 comprises a tube 290 disposed in contact with the lower surface 288 of the platen 280. The tube 290 is coupled to a fluid source 294 that circulates a fluid through the tube. The fluid, for example, facility water from the fluid source 294, may optionally be thermally regulated. The tube 290 may be disposed in a substantially circular or spiral pattern against the lower surface 288 of the platen 280. Typically, the tube 290 is brazed to or clamped against the lower surface 288 or adhered using a thermally conductive adhesive. Optionally, a conductive plate (not shown), such as a copper plate may alternatively be disposed between the tube 290 and platen 280 to promote uniformity of heat transfer across the width of the platen 280.

The hoop 220 having the substrate holders 204, 206 coupled thereto may be lowered to a first position where an upper surface 292 of the platen 280 is in close proximity or in contact with the substrate supported by the second substrate holder 206. In the first position, the platen 280 may be used to regulate the temperature of the substrate disposed on (or proximate to) the platen 280. For example, thermal energy may be transferred from a substrate through the platen 280 to the heat transfer element 286 to cool the substrate. After cooling the substrate, the substrate holders 204, 206 may be raised towards the top 214 of the chamber body 202 to allow the robots 130, 114 to access to the substrate seated in the second substrate support 206. Optionally, the holders 204, 206 may be lowered to a position where the upper surface 292 is in contact or close proximity to the substrate supported by the first substrate holder 204. In this position, the platen 280 may be used to thermally regulate and heat the substrate.

Figure 4:
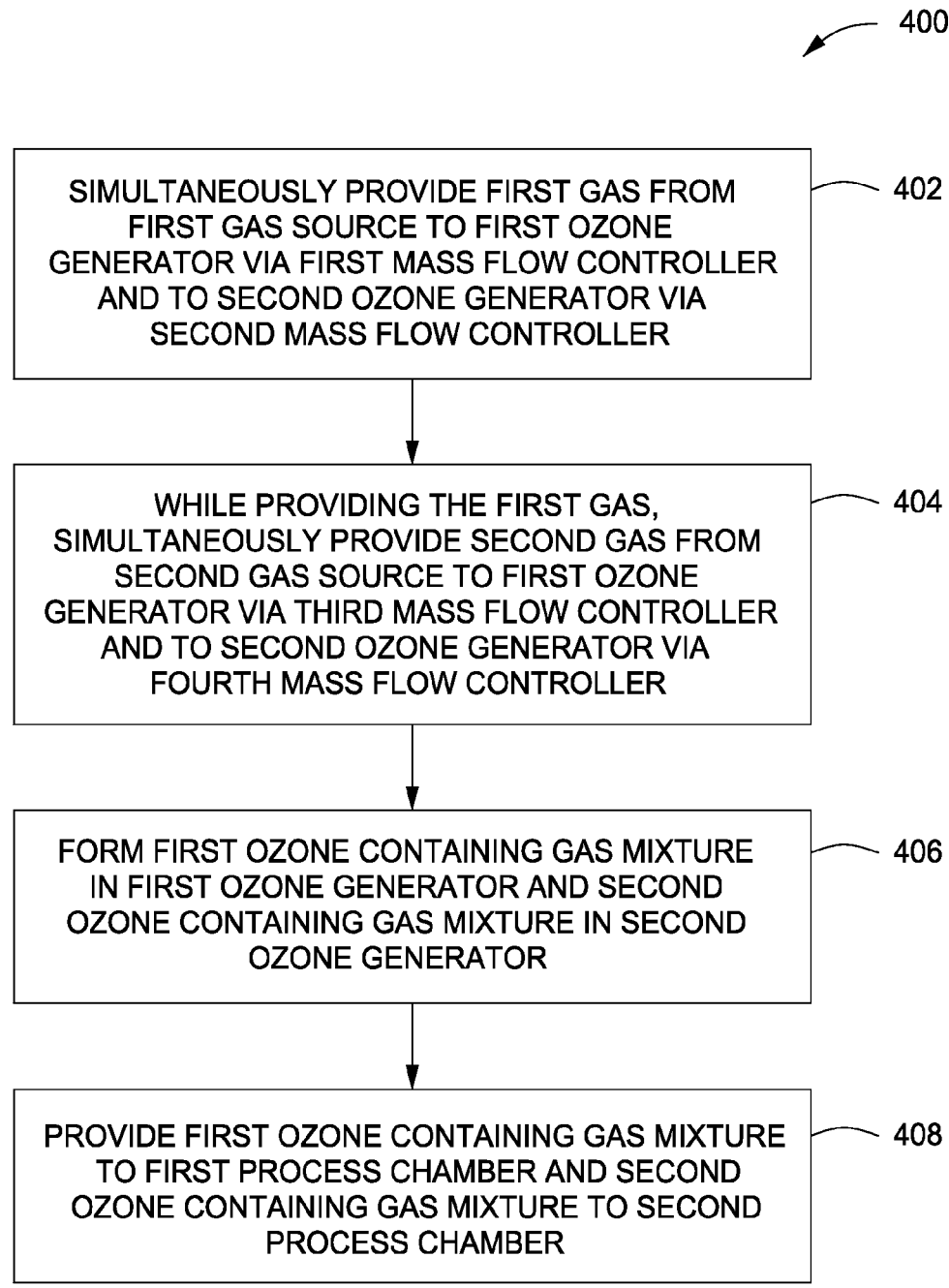
FIG. 4 depicts a flow diagram of a method for providing a gas mixture to a pair of process chambers in accordance with some embodiments of the present invention.

The inventive apparatus disclosed above may be used to provide the first and second ozone containing gas mixtures to a pair of process chambers for processing substrate disposed therein. For example, FIG. 4 depicts a flow diagram of a method 400 for providing a gas mixture to a pair of process chambers in accordance with some embodiments of the present invention. The inventive method is described below in accordance with the embodiments of the processing system 100 discussed above and illustrated in FIGS. 1-3. However, the description is merely exemplary and the inventive method 400 can be used in other processing systems modified in accordance with the teachings provided herein.

The method 400 generally starts at 402 by providing a first gas from a first gas source (e.g., a nitrogen gas source 302) to a first ozone generator 314 via a first mass flow controller 308 and to a second ozone generator 316 via a second mass flow controller 306. The first gas source is coupled to the first ozone generator 314 via a first gas line 324 and to the second ozone generator 316 via a second gas line 322. As described above, the first gas may include nitrogen gas ($N_2$).

At 404, a second gas may be provided from a second gas source (e.g., an oxygen gas source 304) to the first ozone generator 314 via a third mass flow controller 310 and to the second ozone generator 316 via a fourth mass flow controller 312. The second gas source is coupled to the first ozone generator 314 via a third gas line 326 and to the second ozone generator 316 via a fourth gas line 328. As described above, the second gas may include oxygen gas ($O_2$). The mass flow controllers 306, 308, 310, 312 prevent pressure fluctuation and independently control flow rates associated with the first gas and the second gas, respectively. In some embodiments, the first gas is combined with the second gas at a position that is downstream from the respective mass flow controllers. The independent mass flow controllers for each gas and for each chamber combined with the junction of the oxygen and nitrogen downstream of their respective mass flow controllers advantageously facilitates each mass flow controller flowing only a single gas, thus the mixture of the gases is completely controlled by the relative flow rates of the two gases.

Next, at 406, a first ozone containing a gas mixture 318 is formed from the combination of the first gas and the second gas in the first ozone generator and a second ozone containing gas mixture 320 is formed from the combination of the first gas and the second gas in the second ozone generator 316.

Next, at 408, the first ozone containing the gas mixture 318 is provided to a first process chamber 122 and the second ozone containing gas mixture 322 to a second process chamber 122 is provided to a load lock chamber 122. For example, the first or second ozone containing gas mixture may be employed as a reactant to remove residues or react with compounds outgassing from processed substrates.

For example, in some embodiments, wherein the first process chamber and the second process chamber are each coupled to a central transfer chamber having a plurality of process chambers coupled thereto to process substrates, the method may further include processing a substrate in one of the plurality of process chambers, and subsequently transferring the substrate to the first process chamber, wherein the substrate is disposed within the first process chamber for at least a portion of time while the first ozone containing gas mixture is provided to the first process chamber. Alternatively or in combination, the method may include processing a first substrate and a second substrate in one or more of the plurality of process chambers; and subsequently transferring the first substrate to the first process chamber and the second substrate to the second process chamber, wherein the first substrate is disposed within the first process chamber for at least a first portion of time while the first ozone containing gas mixture is provided to the first process chamber, and wherein the second substrate is disposed within the second process chamber for at least a second portion of time while the second ozone containing gas mixture is provided to the second process chamber. In some embodiments, the first substrate is disposed in the first process chamber for a first period of time and the second substrate is disposed in the second process chamber for a second period of time, wherein the first and second periods of time overlap.

Thus, methods and apparatus for providing a gas mixture to a pair of process chambers has been provided. The inventive methods and apparatus may facilitate more accurate control over the gas mixture when shared gases are split and provided to multiple process chambers.

While the foregoing is directed to embodiments of the present invention, other and further embodiments of the invention may be devised without departing from the basic scope thereof.

The invention claimed is:

1. A method for supplying a gas mixture to a pair of process chambers, comprising:
   providing a first gas comprising oxygen from a first gas source to a first ozone generator via a first mass flow controller and to a second ozone generator via a second mass flow controller;
   while providing the first gas, providing a second gas comprising nitrogen from a second gas source to the first ozone generator via a third mass flow controller and to the second ozone generator via a fourth mass flow controller;
   forming a first ozone containing gas mixture in the first ozone generator and a second ozone containing gas mixture in the second ozone generator, wherein a composition of the first ozone containing gas mixture and a composition of the second ozone containing gas mixture are independently controllable; and
   providing the first ozone containing gas mixture to a first process chamber and the second ozone containing gas mixture to a second process chamber, wherein the first and second process chambers are coupled to a common processing platform.

2. The method of claim 1, wherein the first gas is oxygen gas ($O_2$).

3. The method of claim 1, wherein the second gas is nitrogen gas ($N_2$).

4. The method of claim 1, further comprising:
   providing the first gas and the second gas to the first ozone generator via a common inlet to the first ozone generator, wherein the first gas and the second gas join together into the common inlet downstream of the first mass flow controller and the third mass flow controller; and providing the first gas and the second gas to the second ozone generator via a common inlet to the second ozone generator, wherein the first gas and the second gas join together into the common inlet downstream of the second mass flow controller and the fourth mass flow controller.

5. The method of claim 1, wherein the first ozone generator and the second ozone generator are disposed in a common ozone rack coupled between the first and second gas sources and the first and second process chambers.

6. The method of claim 1, wherein the first and second process chambers are load lock chambers.

7. The method of claim 6, wherein the first process chamber and the second process chamber are each coupled to a central transfer chamber having a plurality of process chambers coupled thereto to process substrates therein.

8. The method of claim 7, further comprising:
processing a substrate in one of the plurality of process chambers; and
subsequently transferring the substrate to the first process chamber, wherein the substrate is disposed within the first process chamber for at least a portion of time while the first ozone containing gas mixture is provided to the first process chamber.

9. The method of claim 7, further comprising:
processing a first substrate and a second substrate in one or more of the plurality of process chambers; and
subsequently transferring the first substrate to the first process chamber and the second substrate to the second process chamber, wherein the first substrate is disposed within the first process chamber for at least a first portion of time while the first ozone containing gas mixture is provided to the first process chamber, and wherein the second substrate is disposed within the second process chamber for at least a second portion of time while the second ozone containing gas mixture is provided to the second process chamber.

10. The method of claim 9, wherein the first substrate is disposed in the first process chamber for a first period of time and the second substrate is disposed in the second process chamber for a second period of time, and wherein the first and second periods of time overlap.

11. A method for supplying a gas mixture to a pair of process chambers, comprising:
providing a first gas comprising oxygen gas ($O_2$) from a first gas source to a first ozone generator via a first mass flow controller and to a second ozone generator via a second mass flow controller;
while providing the first gas, providing a second gas comprising nitrogen gas ($N_2$) from a second gas source to the first ozone generator via a third mass flow controller and to the second ozone generator via a fourth mass flow controller;
forming a first ozone containing gas mixture in the first ozone generator and a second ozone containing gas mixture in the second ozone generator, wherein a composition of the first ozone containing gas mixture and a composition of the second ozone containing gas mixture are independently controllable; and
providing the first ozone containing gas mixture to a first process chamber and the second ozone containing gas mixture to a second process chamber, wherein the first and second process chambers are coupled to a common processing platform, and wherein a flow rate of the first ozone containing gas mixture and a flow rate of the second ozone containing gas mixture are independently controllable.

12. The method of claim 11, further comprising:
providing the first gas and the second gas to the first ozone generator via a common inlet to the first ozone generator, wherein the first gas and the second gas join together into the common inlet downstream of the first mass flow controller and the third mass flow controller; and
providing the first gas and the second gas to the second ozone generator via a common inlet to the second ozone generator, wherein the first gas and the second gas join together into the common inlet downstream of the second mass flow controller and the fourth mass flow controller.

13. The method of claim 11, wherein the first ozone generator and the second ozone generator are disposed in a common ozone rack coupled between the first and second gas sources and the first and second process chambers.

14. The method of claim 11, wherein the first and second process chambers are load lock chambers.

15. The method of claim 14, wherein the first process chamber and the second process chamber are each coupled to a central transfer chamber having a plurality of process chambers coupled thereto to process substrates therein.

16. The method of claim 15, further comprising:
processing a substrate in one of the plurality of process chambers; and
subsequently transferring the substrate to the first process chamber, wherein the substrate is disposed within the first process chamber for at least a portion of time while the first ozone containing gas mixture is provided to the first process chamber.

17. The method of claim 15, further comprising:
processing a first substrate and a second substrate in one or more of the plurality of process chambers; and
subsequently transferring the first substrate to the first process chamber and the second substrate to the second process chamber, wherein the first substrate is disposed within the first process chamber for at least a first portion of time while the first ozone containing gas mixture is provided to the first process chamber, and wherein the second substrate is disposed within the second process chamber for at least a second portion of time while the second ozone containing gas mixture is provided to the second process chamber.

18. The method of claim 1, further comprising:
performing an abatement process on a substrate disposed within the first process chamber while providing the first ozone containing gas mixture.

* * * * *